United States Patent
Saita et al.

(10) Patent No.: US 7,561,406 B2
(45) Date of Patent: Jul. 14, 2009

(54) NICKEL SUBSTRATE THIN FILM CAPACITOR AND METHOD OF MANUFACTURING NICKEL SUBSTRATE THIN FILM CAPACITOR

(75) Inventors: Hitoshi Saita, Tokyo (JP); Yuko Saya, Tokyo (JP); Kiyoshi Uchida, Tokyo (JP); Kenji Horino, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/730,154

(22) Filed: Mar. 29, 2007

(65) Prior Publication Data

US 2007/0230086 A1 Oct. 4, 2007

(30) Foreign Application Priority Data

Mar. 30, 2006 (JP) ............... 2006-95436
Mar. 29, 2007 (JP) ............... 2007-87222

(51) Int. Cl.
*H01G 4/008* (2006.01)
*H01G 4/06* (2006.01)
*H01G 7/00* (2006.01)

(52) U.S. Cl. ............. 361/305; 361/311; 29/25.42
(58) Field of Classification Search .......... 361/305, 361/311, 301.1, 303; 29/25.42
See application file for complete search history.

(56) References Cited

U.S. PATENT DOCUMENTS 4,584,074 A * 4/1986 Sterling et al. ........... 204/487
2002/0145845 A1 * 10/2002 Hunt et al. ................ 361/303
2007/0172592 A1 * 7/2007 Trolier-McKinstry et al. .............. 427/287

FOREIGN PATENT DOCUMENTS

JP A-2000-164460 6/2000
JP A-2003-526880 9/2003

OTHER PUBLICATIONS

ESPI—High purity metal specialist, Feb. 7, 2004 http://web.archive.org/web/20040207072454/http://www.espimetals.com/metals/catnickel.htm.*
Goodfellow http://web.archive.org/web/20051228073138/http://www.goodfellow.com/csp/active/gfhome.csp?Language=A Dec. 28, 2005.*

* cited by examiner

*Primary Examiner*—Eric Thomas
*Assistant Examiner*—David M Sinclair
(74) *Attorney, Agent, or Firm*—Oliff & Berridge, PLC

(57) ABSTRACT

A thin film capacitor with high capacity and low leak current is provided. The thin film capacitor includes a nickel substrate with nickel (Ni) purity of 99.99 weight percent or above, and a dielectric layer and an electrode layer disposed in this order on the nickel substrate. The thin film capacitor is typically manufactured as follows. A precursor dielectric layer is formed on a nickel substrate with nickel purity of 99.99 weight percent or above, and is subjected to annealing to form a dielectric layer. The diffusion of impurities from the nickel substrate to the precursor dielectric layer during annealing is suppressed.

9 Claims, 3 Drawing Sheets

NICKEL SUBSTRATE THIN FILM CAPACITOR AND METHOD OF MANUFACTURING NICKEL SUBSTRATE THIN FILM CAPACITOR

BACKGROUND OF THE INVENTION

1. Field of the Invention

The present invention relates to a thin film capacitor using a nickel (Ni) substrate as at least one electrode and a method of manufacturing such a thin film capacitor. Particularly, the present invention relates to a capacitor as use of controlling Electro Magnetic Interference (EMI) produced according to supply voltage fluctuation of Large Scale Integration (LSI), and moreover, relates to a thin film capacitor suitably used as a capacitor equipped on a print substrate as being buried or attached and a method of manufacturing such a thin film capacitor.

2. Description of the Related Art

Various methods of the related art have been proposed for preventing Electro Magnetic Interface (EMI) produced from integrated circuits such as Large Scale Integration (LSI). For example, in order to control EMI produced with supply voltage fluctuation of LSI, discrete capacitors of the related art are disposed on wiring which connects power supply and power supply terminals of integrated circuits.

With the recent size reduction of electronic equipment, a capacitor for such use is desirable to be thin-shaped and well arranged. Thus, as described in Japanese Patent Publication Nos. 2000-164460 and 2005-39282, and Japanese Unexamined Patent Publication No. 2003-526880, generally performed is a capacitor formed in an array in a thin film shape sheet and the sheet is attached directly to a surface of an interposer or a print substrate, or buried inside of an interposer or a print substrate. In addition, not limited to the use for controlling EMI produced with supply voltage fluctuation of LSI, a capacitor for the other use may be attached directly to a surface of an interposer or a print substrate, or buried inside of an interposer or a print substrate in the same way as described above.

Because a thickness of a dielectric layer is thin in a thin film capacitor for such use, materials with high relative dielectric constant are used for the dielectric layer to enhance a capacitance density of the dielectric layer. The materials with high relative dielectric constant are, for example, perovskite-type oxides represented as $ABO_3$ by the general formula. The perovskite-type oxides are, for example, barium titanium oxide (BT), lead zirconium titanate (PZT), lead lanthanum zirconate titanate (PLZT), lead magnesium niobate (PMN), barium strontium titanate (BST), and the like. The perovskite-type oxides can be obtained by crystallizing a precursor with annealing. High temperature annealing can enhance the relative dielectric constant.

SUMMARY OF THE INVENTION

However, a problem is that the capacity of a thin film capacitor is not high and leak current is large when manufacturing conditions are changed such that annealing temperature is raised or annealing time is extended in order to increase the dielectric constant.

In view of the foregoing, it is desirable to provide a thin film capacitor with high capacity and low leak current and a method of manufacturing a thin film capacitor device and the thin film capacitor.

For the thin film capacitor according to an embodiment of the present invention, a dielectric layer and an electrode layer are disposed in this order on a nickel substrate with nickel purity of 99.99 weight percent or above. Here, the nickel substrate is not particularly limited in a thickness, but preferably has the thickness that can allow a thin film capacitor to be independent.

For the thin film capacitor according to an embodiment of the present invention, the dielectric layer is provided on the nickel substrate with nickel purity of 99.99 weight percent or above. Thus, for example, the dielectric layer before annealing (a precursor dielectric layer) is formed on the nickel substrate, and the precursor dielectric layer is annealed to produce the thin film capacitor. In this case, when one or more impurities (for example, at least one selected from the group consisting of iron, titanium, copper, aluminum, magnesium, manganese, silicon and chromium) included in the nickel substrate are diffused from the nickel substrate to the precursor dielectric layer during annealing, the diffusion amount can be controlled to a small amount.

For example, each of the contents of one or more impurities in the nickel substrate is adapted to be 65 ppm or below and the dielectric layer is formed by annealing. In this case, when one or more impurities included in the nickel substrate are diffused from the nickel substrate to the precursor dielectric layer, the diffusion amount can be controlled to an extremely small amount.

A method of manufacturing a thin film capacitor according to an embodiment of the present invention includes steps of forming the precursor dielectric layer on the nickel substrate with nickel purity of 99.99 weight percent or above and then forming the dielectric layer by crystallizing the precursor dielectric layer with annealing.

In a method of manufacturing a thin film capacitor according to an embodiment of the present invention, the precursor dielectric layer formed on the nickel substrate is annealed so that the precursor dielectric layer is crystallized to be the dielectric layer with a high dielectric constant. Here, the nickel substrate has a nickel purity of 99.99 weight percent or above. In this case, when one or more impurities (for example, at least one selected from the group consisting of iron, titanium, copper, aluminum, magnesium, manganese, silicon and chromium) included in the nickel substrate are diffused from the nickel substrate to the precursor dielectric layer during annealing, the diffusion amount can be controlled to a small amount.

Here, each of the contents of one or more impurities in the nickel substrate is adapted to be 65 ppm or below. In this case, when one or more impurities included in the nickel substrate are diffused from the nickel substrate to the precursor dielectric layer, the diffusion amount can be controlled to an extremely small amount.

For the thin film capacitor according to an embodiment of the present invention, the dielectric layer is provided on the nickel substrate with nickel purity of 99.99 weight percent or above. Therefore, for example, when one or more impurities included in the nickel substrate are diffused from the nickel substrate to the precursor dielectric layer during annealing, the diffusion amount can be controlled to a small amount. Thus, there is almost no likelihood that the properties of the dielectric layer are changed because of impurities included in the dielectric layer. As a result, the capacity of the thin film capacitor can be maintained high and the leak current can be controlled low.

Also, in case of forming the dielectric layer by annealing, each of the contents of one or more impurities in the nickel substrate is adapted to be 65 ppm or below. In this case, when one or more impurities included in the nickel substrate are diffused from the nickel substrate to the precursor dielectric layer, the diffusion amount can be controlled to an extremely small amount. Thus, there is no likelihood at all that the properties of the dielectric layer are changed because of impurities included in the dielectric layer. As a result, the capacity of the thin film capacitor can be maintained extremely high and the leak current can be controlled extremely low.

Also, in case that the nickel substrate is a nickel plate with a thickness of 300 μm or above, or nickel foil with a thickness of 1 μm or above and below 300 μm, the rigidness of nickel substrate can allow the thin film capacitor to be independent. Thus, the thin film capacitor can, for example, be attached directly to a surface of an interposer or print substrate, or buried inside of an interposer or print substrate.

Also, in case that the dielectric layer is composed of a dielectric including at least one element selected from the group consisting of barium (Ba), strontium (Sr), calcium (Ca), lead (Pb), titanium (Ti), and zirconium (Zr), the capacity of the thin film capacitor can be extremely large. In case the thickness of the dielectric layer is 0.05 μm or above and 5 μm or below, the nickel substrate and the electrode layer provided at both sides of the dielectric layer can be certainly prevented from a short circuit with each other and capacity reduction of the thin film capacitor is prevented as well. When the thin film capacitor is, for example, attached directly to a surface of the interposer or the print substrate, or buried inside of the interposer or print substrate, cracks in the dielectric layer caused by stress of the interposer or print substrate can be prevented.

Other and further objects, features and advantages of the invention will appear more fully from the following description.

DETAILED DESCRIPTION OF THE PREFERRED EMBODIMENTS

An embodiment of the present invention is described in detail with reference to the accompanying drawings.

Figure 1:
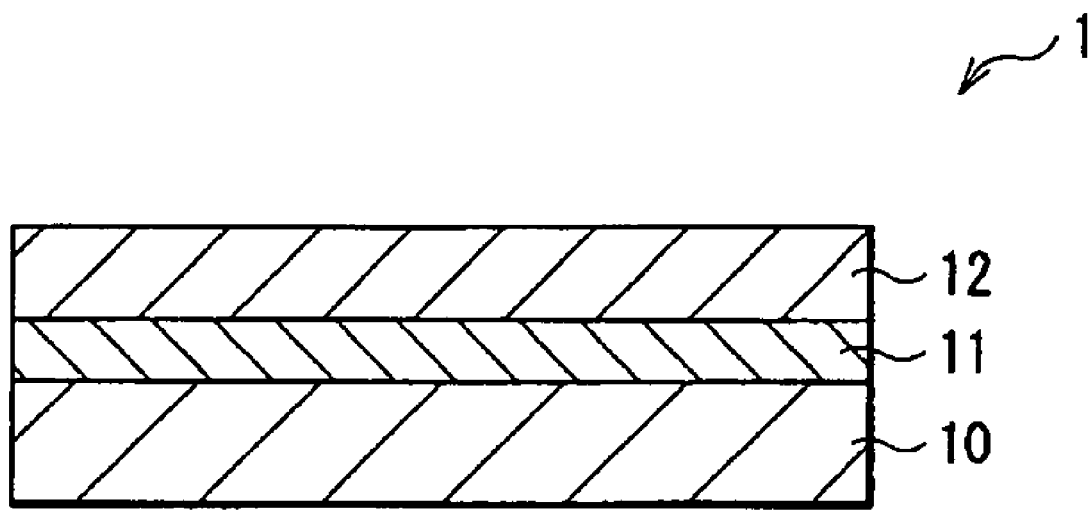
FIG. 1 is a cross-sectional configuration diagram of a thin film capacitor according to an embodiment of the present invention.
Figure 2:
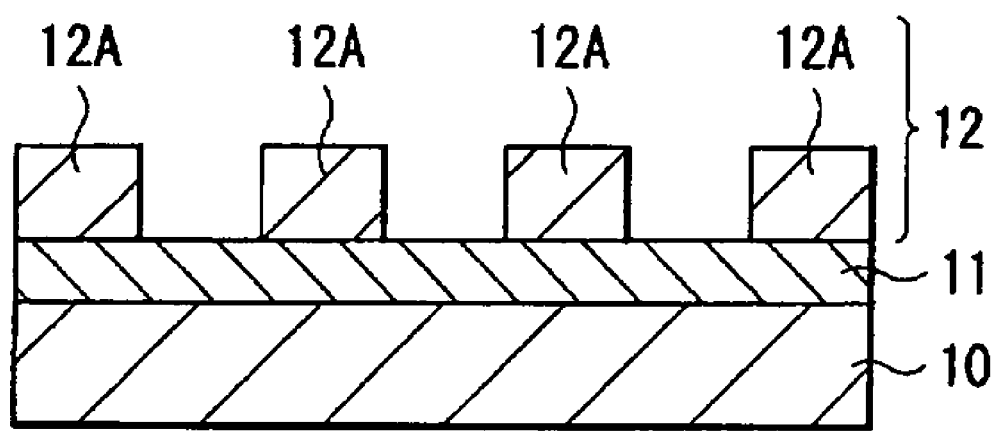
FIG. 2 is a cross-sectional configuration diagram of the thin film capacitor according to a modification of the present invention.

FIG. 1 shows a cross section of a thin film capacitor 1 according to an embodiment of the present invention. FIG. 2 shows a modification of the thin film capacitor 1. The thin film capacitor 1 is configured such that a dielectric layer 11 and an electrode layer 12 are stacked in this order on a nickel substrate 10 as shown in FIG. 1.

The nickel substrate 10 is a nickel plate with a thickness of 300 μm or above, or nickel foil with a thickness of 1 μm or above and below 300 μm. The nickel substrate 10 is an electrode disposed as opposed to the electrode layer 12. The rigidness of the nickel substrate 10 can allow the thin film capacitor 1 to be independent. Therefore, the nickel substrate 10 enables the thin film capacitor 1, for example, to be attached directly to a surface of an interposer or print substrate, or buried inside of an interposer or print substrate. However, in case that the nickel substrate 10 is formed using electrolytic method described later, the nickel substrate 10 is preferably composed of nickel foil suitable to be wound by a metal roll, and the thickness is preferably 5 μm or above and 100 μm or below, and more preferably 10 μm or above and 60 μm or below.

The nickel substrate 10 has nickel purity of 99.99 weight percent or above. That is, the total content of impurities included in the nickel substrate 10 is below 100 ppm. Impurities included in the nickel substrate 10 are, for example, iron (Fe), titanium (Ti), copper (Cu), aluminum (Al), magnesium (Mg), manganese (Mn), silicon (Si), and chromium (Cr). Each of the contents of impurities is preferably 65 ppm or below. Other than described above, in case that the nickel substrate 10 includes soluble elements to a precursor dielectric layer 11D (described later), for example transition metal elements or rare earth elements including vanadium (V), zinc (Z), niobium (Nb), tantalum (Ta), yttrium (Y), lanthanum (La) and cerium (Ce), or influential elements to annealing of the thin film including chlorine (Cl), sulfur (S) and phosphorus (P), diffusion of the elements to the precursor dielectric layer 11D may cause a shift in the dielectric composition, thereby likely changing the fine structure with obstruction of crystallization and crystal grain growth, and reducing the insulation resistance remarkably. The shift in the dielectric composition or the change of the fine structure tends to decrease the capacity of the thin film capacitor 1 and increase the leak current. Accordingly, impurities included in the nickel substrate 10 are preferably small amounts for even other elements than those described above.

Here, the nickel substrate 10 can, for example, be formed by rolling method, electrolytic method or powder metallurgy method. Rolling method is a method of forming the nickel substrate 10 by melting down or softening nickel ingot material and then making it into a foil shape with rolling and annealing. In this case, a refining process is necessarily repeated several times to obtain the nickel substrate 10 with high nickel purity of 99.99 weight percent or above. Electrolytic method is a method of forming the nickel substrate 10 by winding an electrodeposited substance that is obtained through electrodeposition on the metal roll dipped in high-purity plating bath. Using electrolytic method, the nickel substrate 10 with high nickel purity of 99.99 weight percent or above can be generally obtained with stability. Powder metallurgy method is a method for forming the nickel substrate 10 by heating and hardening high-purity nickel powder. In this case, although it is unpractical in a sense as steps of heating and hardening are necessary, the nickel substrate with high nickel purity of 99.99 weight percent or above can be obtained. Each of the three methods may include steps of rolling and heating after forming the nickel foil in order to obtain the desirable thickness. In this way, the nickel substrate 10 with high nickel purity and the desirable thickness can be obtained.

According to the embodiment of the present invention, the purity of the nickel substrate 10 and the contents of impurities included in the nickel substrate 10 were measured quantitatively by Inductively Coupled Plasma (ICP) analysis. Thus, the values were measured without considering the contents of elements that were difficult to be measured by ICP analysis (for example, carbon (C) and sulfur (S)). Also, the values obtained by ICP analysis are the average volume values and are unrelated to whether or not nickel or the impurities are dispersed uniformly in the nickel substrate 10.

The dielectric layer 11 is configured to include the materials with high relative dielectric constant, specifically, perovskite-type oxides represented as $ABO_3$ by the general formula, ilmenite-type oxides, pyrochlore-type oxides, spinel-type oxides or layered compound-type oxides. Here, perovskite-type oxides are, for example, barium titanium oxide (BT), lead zirconium titanate (PZT), lead lanthanum zirconate titanate (PLZT), lead magnesium niobium oxide (PMN), barium strontium titanate (BST), and the like. The perovskite-type oxides can be obtained by annealing and crystallizing a precursor and the relative dielectric constant can be enhanced by crystallizing. Here, the dielectric layer 11 is preferably configured to include at least one of Ba and Ti as an element in perovskite-type oxides. Particularly preferred are BT and BST because of not including lead as a harmful substance and enabling the capacity of the thin film capacitor to become extremely large. Annealing temperature is preferably 600° C. or above and 1000° C. or below, because when annealing temperature is below 600° C., the precursor dielectric layer 11D is not sufficiently crystallized and the capacity of the thin film capacitor 1 is remarkably decreased. On the other hand, when annealing temperature is above 1000° C., the leak current and dielectric loss in the thin film capacitor 1 becomes extremely large.

The dielectric layer 11 uses, for example, solution method or vapor phase method to form the precursor dielectric layer 11D on the nickel substrate 10. The precursor dielectric layer 11D is then annealed so that can be crystallized to be the dielectric layer 11. Because the dielectric layer 11 is formed through a step of annealing the precursor dielectric layer 11D as described above, the dielectric layer 11 includes the substances dispersed from the nickel substrate 10 during the annealing step. In addition, although the same substances as the impurities that are possibly included in the nickel substrate 10 may be intentionally added to the precursor dielectric layer 11D for various reasons, each of the contents of one or more impurities included in the dielectric layer 11 is necessarily smaller than the predetermined value, irrespective of whether or not the precursor dielectric layer 11D includes such additives. In case each of the contents of the impurities is equal to or above the predetermined value, the properties of the dielectric layer 11 are changed due to the impurities. As a result, there is a likelihood that the capacity of the thin film capacitor 1 may be decreased or the leak current may become larger.

The thickness of the dielectric layer 11 is adapted to be 0.05 µm or above and 5 µm or below. By setting the thickness 0.05 µm or above, the nickel substrate 10 and the electrode layer 12 provided at both sides of the dielectric layer 11 can be certainly prevented from a short circuit with each other. By setting the thickness 5 µm or below, the capacity reduction of the thin film capacitor 1 can be prevented. In addition, when the thin film capacitor is, for example, attached directly to a surface of the interposer or the print substrate, or buried inside of the interposer or print substrate, cracks in the dielectric layer 11 caused by stress of the interposer or print substrate can be prevented.

The electrode layer 12 is composed of metal, for example, copper (Cu). As described later, the electrode layer 12 is formed on the dielectric layer 11 after annealing using, for example, sputtering method, evaporation method, or plating method. Accordingly, there is no likelihood that the substances included in the electrode layer 12 are dispersed into the dielectric layer 11.

Figure 3:
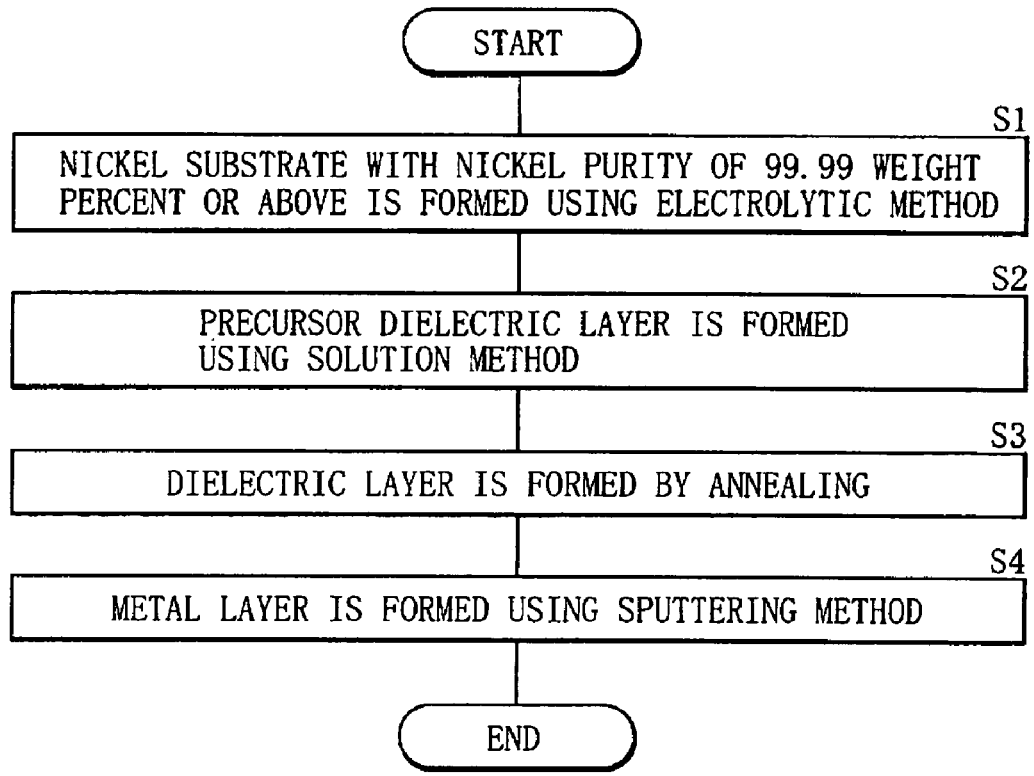
FIG. 3 is a flow chart explaining a method of manufacturing the thin film capacitor.
Figure 4A:
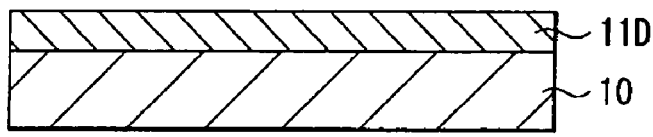
FIGS. 4A to 4B are cross-sectional configuration diagrams explaining a method of manufacturing the thin film capacitor.
Figure 4B:
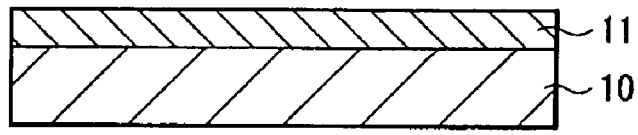

Next, with reference to FIGS. 3, 4A and 4B, an example is explained as a method of manufacturing the thin film capacitor 1 having the configuration described above.

Using solution method, the metal roll is dipped in high-purity plating bath not including organic additive agents and the resulting substance is electrodeposited. After that, the electrodeposited substance is wound in order on the metal roll. Thus, the nickel substrate with nickel purity of 99.99 weight percent or above is formed (Step S1).

Next, using electrolytic method, the precursor solution (composition: $Ba_{0.7}Sr_{0.3}TiO_3$) including octate of each of Ba, Sr and Ti as a precursor of metal compound is applied on the nickel substrate 10. After that, the precursor solution is disposed on a hot plate in the air, heated and dried for 10 minutes with 150° C., and then heated for 10 minutes with 400° C. to be temporarily annealed. Thus, a thin precursor dielectric layer (not shown) is formed. After that, the steps of applying, drying and temporary annealing as described above are repeated so that the thin precursor dielectric layers are stacked until obtaining a desirable thickness. From this, the precursor dielectric layer 11D is formed on the nickel substrate 10 (Step S2, as shown in FIG. 4A).

Next, in the infrared ray oven decompressed to 0.005 Pa, the precursor dielectric layer 11D is heated for 30 minutes with 600° C. or above and 1000° C. or below to be annealed. Thus, the precursor dielectric layer 11D is changed into the dielectric layer 11 by crystallizing (Step S3, as shown in FIG. 4B).

Next, using sputtering method, Cu is stacked on the dielectric layer 11. Thus, the metal layer 12 is formed on the dielectric layer 11 (Step S4, as shown in FIG. 1). In this way, the thin film capacitor 1 of the embodiment is formed.

For the thin film capacitor 1 of the embodiment of the present invention, when manufacturing the thin film capacitor 1, the precursor dielectric layer 11D is formed on the nickel substrate 10 with nickel purity of 99.99 weight percent or above, and the precursor dielectric layer 11D is annealed. Thus, when one or more impurities (for example, at least one selected from the group consisting of iron, titanium, copper, aluminum, magnesium, manganese, silicon and chromium) included in the nickel substrate 10 are diffused from the nickel substrate 10 to the precursor dielectric layer 11D during annealing, the diffusion amount can be controlled to a small amount. That is, the contents of impurities in the nickel substrate 10 are hardly changed when comparing before annealing and after annealing. From this, there is almost no likelihood that the properties of the dielectric layer 11 are changed due to impurities included in the dielectric layer 11. As a result, the capacity of the thin film capacitor 1 can be maintained high and the leak current can be controlled low.

Each of the contents of one or more impurities in the nickel substrate 10 is adapted to be 65 ppm or below and the dielectric layer 11 is formed by annealing. In this case, when one or more impurities included in the nickel substrate 10 are diffused from the nickel substrate 10 to the precursor dielectric layer 11D, the diffusion amount can be controlled to an extremely small amount. This diffusion amount can be known theoretically by measuring a difference of the contents of impurities in the nickel substrate 10 between before annealing and after annealing. However, the difference is below the detection limit in ICP analysis and immeasurable by ICP analysis today. Accordingly, there is no likelihood at all that the properties of the dielectric layer 11 are changed due to impurities included in the dielectric layer 11. As a result, the capacity of the thin film capacitor 1 can be maintained extremely high and the leak current can be controlled extremely low.

In comparison with a comparative example, explained below is an example of the thin film capacitor 1 manufactured by the manufacturing method described above. The comparative example is different from the example in configuration at the point that the contents of impurities included in the nickel substrate 10 are higher than those of the example.

Three types of nickel substrates a1, a2, and a3 as the nickel substrate 10 were prepared in the example. On the other hand, two types of nickel substrates b1 and b2 as the nickel substrate 10 were prepared in the comparative example shown below (refer to Table 1). In addition, the data in Table 1 shows impurity values (weight by ppm) analyzed by ICP analysis in the nickel substrates a1, a2, a3, b1 and b2 before forming films. As shown in Table 1, each of the contents of impurities included in the nickel substrates a1, a2, and a3 was 65 ppm or below. On the other hand, in each of the nickel substrates b1 and b2, the content of at least one of impurities was above 65 ppm.

TABLE 1

| Nickel Substrate | Ni (%) | Fe | Ti | Cu | Al | Mg | Mn | Si | Cr | Other |
|---|---|---|---|---|---|---|---|---|---|---|
| a1 | 99.998 | 9 | 0 | 6 | 0 | 0 | 2 | 2 | 0 | 3 |
| a2 | 99.995 | 20 | 0 | 25 | 0 | 0 | 3 | 4 | 1 | 2 |
| a3 | 99.991 | 65 | 0 | 6 | 0 | 0 | 10 | 6 | 1 | 4 |
| b1 | 99.688 | 407 | 4 | 5 | 114 | 0 | 1856 | 596 | 113 | 22 |
| b2 | 99.569 | 690 | 111 | 43 | 444 | 285 | 1332 | 1110 | 279 | 21 |

Table 2 shows the average and minimum capacity, the average and maximum leak current, and the average and maximum dielectric loss of the thin film capacitor 1, when annealing the thin film capacitor 1 with 800% for manufacturing the thin film capacitor 1 using the nickel substrates a1, a2, a3, b1 and b2, respectively.

Table 3 shows the average and minimum capacity, the average and maximum leak current, and the average and maximum dielectric loss of the thin film capacitor 1, when annealing the thin film capacitor 1 with a total six kinds of temperatures from 600° C. to 1100° C. at every 100° C., respectively. In addition, the capacity and leak current of the thin film capacitor were measured over the measurement area of 15 mm square.

The data in Tables 2 and 3 show the average values when manufacturing one hundred thin film capacitors 1 for each of the nickel substrates a1, a2, a3, b1, and b2 with annealing temperatures 600° C., 700° C., 800° C., 900° C., 1000° C., and 1100° C.

TABLE 2

| Nickel Substrate | Capacity (μF) | | Leak Current (A) | | Dielectric Loss (%) | |
|---|---|---|---|---|---|---|
| | Average | Minimum | Average | Maximum | Average | Maximum |
| a1 | 4.1 | 3.5 | $2 \times 10^{-8}$ | $4 \times 10^{-8}$ | 1.3 | 3.5 |
| a2 | 4.1 | 3.4 | $3 \times 10^{-8}$ | $8 \times 10^{-8}$ | 1.2 | 2.8 |
| a3 | 3.8 | 3.1 | $4 \times 10^{-8}$ | $6 \times 10^{-8}$ | 1.5 | 3.3 |
| b1 | 0.9 | 0.3 | $6 \times 10^{-7}$ | $5 \times 10^{-3}$ | 1.3 | 15.6 |
| b2 | 0.7 | 0.2 | $5 \times 10^{-5}$ | $8 \times 10^{-3}$ | 1.2 | 12.8 |

TABLE 3

| Annealing Temperature (° C.) | Capacity (μF) | | Leak Current (A) | | Dielectric Loss (%) | |
|---|---|---|---|---|---|---|
| | Average | Minimum | Average | Maximum | Average | Maximum |
| 600 | 2.5 | 2.1 | $4 \times 10^{-9}$ | $1 \times 10^{-8}$ | 0.5 | 0.9 |
| 700 | 3.4 | 3.1 | $1 \times 10^{-8}$ | $3 \times 10^{-8}$ | 0.4 | 1.2 |
| 800 | 4.1 | 3.5 | $2 \times 10^{-8}$ | $4 \times 10^{-8}$ | 1.3 | 3.5 |
| 900 | 4.4 | 3.7 | $5 \times 10^{-8}$ | $9 \times 10^{-8}$ | 2.5 | 5.8 |
| 1000 | 4.6 | 3.9 | $1 \times 10^{-7}$ | $3 \times 10^{-7}$ | 3.3 | 6.1 |
| 1100 | 4.7 | 4.1 | $2 \times 10^{-6}$ | $7 \times 10^{-6}$ | 9.8 | 11.4 |

From Table 2, it is understood that the thin film capacitor 1 of the example has the equivalent properties to the thin film capacitors in the comparative example in respect to the average value of dielectric loss. However, the thin film capacitor 1 of the example has exceptionally superior properties than the thin film capacitors in the comparative example in respect to the points other than the average value of dielectric loss. That is, in case each of the contents of impurities included in the nickel substrates a1, a2, and a3 is 65 ppm or below, the thin film capacitor has extremely superior properties in comparison with the other cases in the table. Also, it is understood that the smaller each of the contents of impurities included in the nickel substrates a1, a2, and a3 is, the larger the capacity is and the smaller the leak current is.

From Table 3, it is understood that when the thin film capacitor 1 is manufactured with the annealing temperature from 700° C. to 1000° C., there are well balanced properties at all the points of the capacity, leak current and dielectric loss. That is, it can be said that the properties of the thin film capacitor 1 are hardly changed with the annealing temperatures from 700° C. to 1000° C. Also, the thin film capacitor 1 manufactured with the annealing temperature 600° C. is more or less inferior in point of the capacity in comparison with the thin film capacitor 1 manufactured with the annealing temperature from 700° C. to 1000° C. However, it is useful for a use in low capacity due to the extremely superior properties in the leak current and dielectric loss. On the other hand, the annealing temperature of above 1100° C. is undesirable because the thin film capacitor 1 manufactured with the annealing temperature 1100° C. has inferior properties in the leak current and dielectric loss in comparison with thin film capacitor 1 of the other cases in the table.

Figure 5:
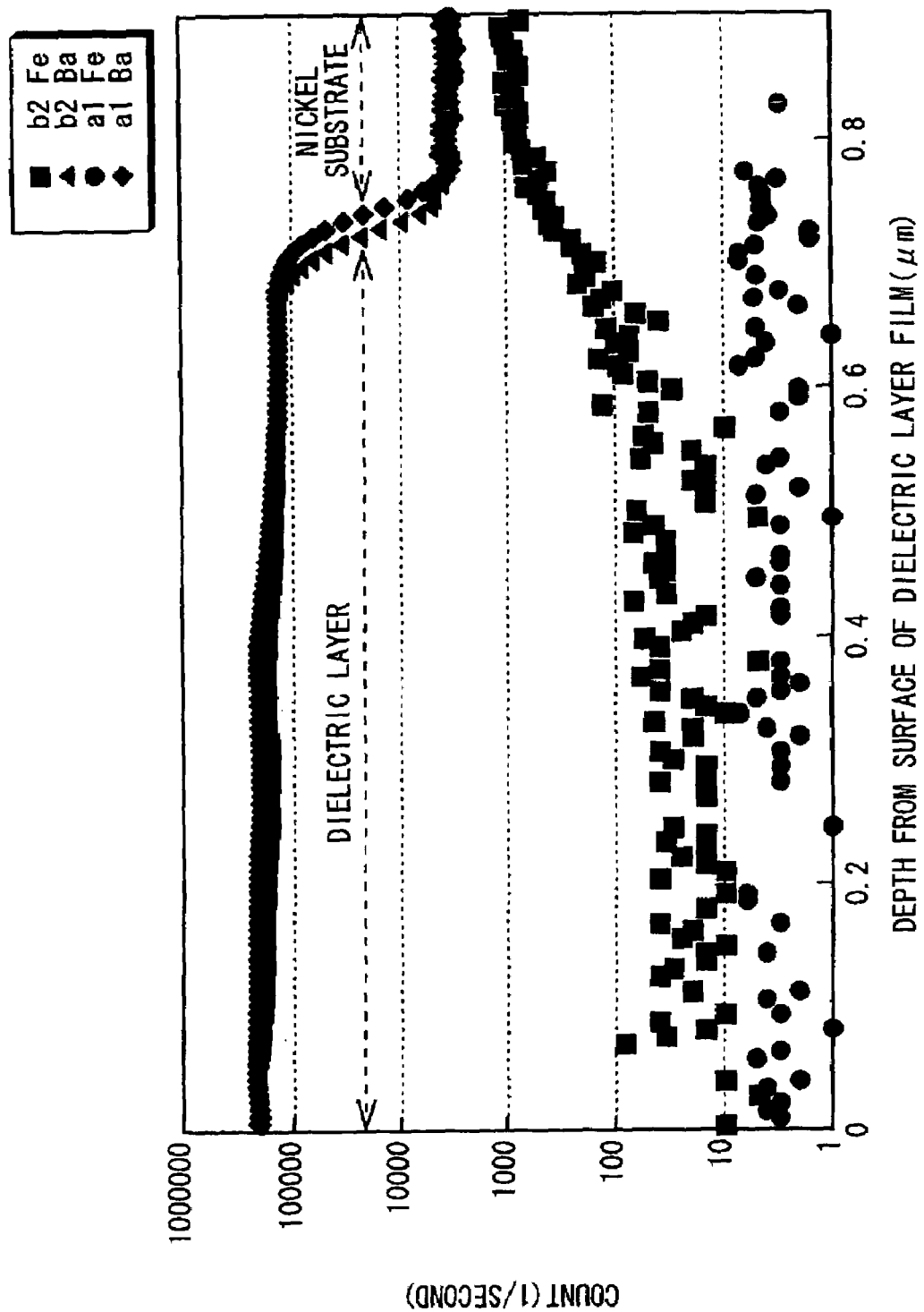
FIG. 5 is a distribution in the thickness direction of impurities included in a dielectric layer of the thin film capacitor according to examples and comparative examples.

FIG. 5 shows a distribution, in the thickness direction, of impurities (Fe and Ba) included in the dielectric layer of $Ba_{0.7}$, $Sr_{0.3}$ and $TiO_3$. In this case, annealing temperature was 800° C. when the dielectric layer of $Ba_{0.7}$, $Sr_{0.3}$ and $TiO_3$ is formed on each of the nickel substrates a1 and b2. The distribution was represented using Secondary Ion-microbe Mass Spectrometer (SIMS) measurement values. Here, 6650 of Physical Electronics, Inc. was used for SIMS measurement and the measurement conditions were as follows.

(Measurement Conditions)

Primary ion species: $O_2\pm$

Primary acceleration voltage: 6.0 kV

Detection range: 60 μm×77 μm

Tables 4, 5 and 6 show a distribution of impurities (Fe, Cu, Al, Mg, Mn, Si and Cr) included in the dielectric layer of $Ba_{0.7}$, $Sr_{0.3}$ and $TiO_3$ at a predetermined distance away from the interface between the dielectric layers and the nickel substrates a1, a2, a3, b1, and b2. In this case, annealing temperature was 800° C. when the dielectric layer of $Ba_{0.7}$, $Sr_{0.3}$ and $TiO_3$ was formed on each of the nickel substrates a1, a2, a3, b1 and b2. The distribution was represented using SIMS measurement values. Table 4 shows the distribution of the impurities included in the dielectric layer at 50 nm away from the interface between the dielectric layer and the nickel substrates. Table 5 shows the same with 100 nm away from the interface between the dielectric layer and the nickel substrates. Table 6 shows the same with 200 nm away from the interface between the dielectric layer and the nickel substrates. For convenience, the position of the interface between the dielectric layer and the nickel substrate is set as a middle point C in an area where the count numbers of an element of Ba change linearly in FIG. 5.

TABLE 4

| Nickel substrate | Fe | Cu | Al | Mg | Mn | Si | Cr |
|---|---|---|---|---|---|---|---|
| a1 | 5.0 | 2.2 | 0.1 | 0.0 | 1.2 | 1.2 | 0.0 |
| a2 | 6.2 | 3.2 | 0.0 | 0.0 | 2.1 | 2.9 | 0.0 |
| a3 | 15.1 | 1.3 | 0.0 | 0.1 | 1.4 | 1.8 | 0.1 |
| b1 | 160.2 | 3.4 | 12.1 | 0.1 | 556.2 | 402.2 | 40.2 |
| b2 | 243.3 | 5.6 | 154.1 | 110.1 | 382.2 | 959.1 | 112.1 |

TABLE 5

| Nickel substrate | Fe | Cu | Al | Mg | Mn | Si | Cr |
|---|---|---|---|---|---|---|---|
| a1 | 4.1 | 4.3 | 0.0 | 0.0 | 2.1 | 2.1 | 0.0 |
| a2 | 3.3 | 3.6 | 0.1 | 0.0 | 1.4 | 2.2 | 0.0 |
| a3 | 10.2 | 2.0 | 0.0 | 0.0 | 1.3 | 1.9 | 0.0 |
| b1 | 64.3 | 5.0 | 3.2 | 0.0 | 368.2 | 101.0 | 16.1 |
| b2 | 95.0 | 4.0 | 50.2 | 48.2 | 172.3 | 331.1 | 48.2 |

TABLE 6

| Nickel substrate | Fe | Cu | Al | Mg | Mn | Si | Cr |
|---|---|---|---|---|---|---|---|
| a1 | 7.0 | 3.3 | 0.2 | 0.0 | 1.3 | 1.2 | 0.0 |
| a2 | 4.2 | 2.3 | 0.1 | 0.0 | 1.5 | 1.8 | 0.0 |
| a3 | 7.3 | 1.3 | 0.3 | 0.0 | 1.1 | 1.1 | 0.1 |
| b1 | 38.2 | 4.3 | 2.3 | 0.0 | 98.2 | 58.2 | 8.2 |
| b2 | 57.0 | 3.3 | 11.2 | 12.3 | 82.1 | 87.3 | 22.1 |

From Table 5, it is understood that Fe in the dielectric layer formed on the nickel substrate a1 is diffused at a count rate of within about 10 counts/second. On the other hand, Fe in the dielectric layer formed on the nickel substrate b2 is diffused at a count rate of over about 10 counts/second. From Table 2, the average value of leak current in the thin film capacitor having the nickel substrate a1 is three digits smaller in comparison with that in the thin film capacitor having the nickel substrate b2. Thus, together with consideration of the result in table 5, magnitude of the leak current is remarkably varied between the case that the count number of Fe in SIMS measurement is 10 counts/second or over, and the case that the count, number of Fe in SIMS measurement is within 10 counts/second. Thus, the leak current can be remarkably small in case that the count number of Fe in SIMS measurement is about 10 counts/second or less.

From Tables 4 to 6, it is understood that the leak current can be remarkably small in the dielectric layer where not so away (for example, 50 nm) from the interface between the dielectric layer and the nickel substrates, in case that the count number of Fe in SIMS measurement is about 10 count/second or less. Also, the leak current can be remarkably small in the dielectric layer at some distance away (for example, 100 nm or above) from the interface between the dielectric layer and the nickel substrate.

The present invention is explained with the embodiments and examples, but is not limited to these as various variations are available.

For example, in the above embodiment, the nickel substrates 10 and the electrode layer 12 are plate shaped but various shapes are available according to a use. For example, for a use as a plurality of decoupling capacitors are buried inside of a print substrate, the electrode layer 12 may be composed of a plurality of electrode portions 12A that are independent with each other as shown in FIG. 2, or similar to the electrode layer 12 in FIG. 2, the nickel substrate 10 may be composed of a plurality of electrode portions (not shown) that are independent with each other.

Obviously many modifications and variations of the present invention are possible in the light of the above teachings. It is therefore to be understood that within the scope of the appended claims the invention may be practice otherwise than as specifically described.

What is claimed is:
1. A thin film capacitor comprising:
    a nickel substrate with nickel (Ni) purity of 99.99 weight percent or above, and
    a dielectric layer and an electrode layer disposed in this order on the nickel substrate,
    wherein the nickel substrate includes the impurities of iron (Fe) at 9 to 65 ppm, copper (Cu) at 6 to 25 ppm, manganese (Mn) at 2 to 10 ppm, and silicon (Si) at 2 to 6 ppm; and
    the nickel substrate can include one or more impurities selected from the group consisting of impurities of titanium (Ti) at 65 ppm or below, aluminum (Al) at 65 ppm or below, and chromium (Cr) at 65 ppm or below.
2. The thin film capacitor according to claim 1, wherein the nickel substrate is a nickel plate with a thickness of 300 μm or above, or nickel foil with a thickness of 1 μm or above and below 300 μm.
3. The thin film capacitor according to claim 1, wherein the dielectric layer is formed of a dielectric material including at least one element selected from the group consisting of barium (Ba), strontium (Sr), calcium (Ca), lead (Pb), titanium (Ti), and zirconium (Zr).
4. The thin film capacitor according to claim 1, wherein the dielectric layer has a thickness of 0.05 μm or above and 5 μm or below.
5. The thin film capacitor according to claim 1, wherein at least one of the electrode layer and the nickel substrate has a plurality of electrode portions that are independent with each other.
6. The thin film capacitor according to claim 1, wherein the nickel substrate includes at least one of manganese (Mn) and silicon (Si) as an impurity at least at 2 ppm.
7. A method of manufacturing a thin film capacitor comprising the steps of:
    forming a precursor dielectric layer on a nickel substrate with nickel purity of 99.99 weight percent or above
    forming a dielectric layer by crystallizing the precursor dielectric layer with annealing; and
    forming an electrode layer on the dielectric layer,
    wherein the nickel substrate includes the impurities of iron (Fe) at 9 to 65 ppm, copper (Cu) at 6 to 25 ppm, manganese (Mn) at 2 to 10 ppm, and silicon (Si) at 2 to 6 ppm; and
    the nickel substrate can include one or more impurities selected from the group consisting of impurities of tita nium (Ti) at 65 ppm or below, aluminum (Al) at 65 ppm or below, and chromium (Cr) at 65 ppm or below.

8. The method of manufacturing the thin film capacitor according to claim 7, wherein annealing temperature for the precursor dielectric layer is 600 degree C. or above and 1000 degree C. or below.

9. The method of manufacturing the thin film capacitor according to claim 7, wherein the nickel substrate includes at least one of manganese (Mn) and silicon (Si) as an impurity at least at 2 ppm.

* * * * *